(12) United States Patent
Pagaila et al.

(10) Patent No.: US 8,304,286 B2
(45) Date of Patent: Nov. 6, 2012

(54) INTEGRATED CIRCUIT PACKAGING SYSTEM WITH SHIELDED PACKAGE AND METHOD OF MANUFACTURE THEREOF

(75) Inventors: Reza Argenty Pagaila, Singapore (SG); Dioscoro A. Merilo, Singapore (SG); Shuangwu Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 68 days.

(21) Appl. No.: 12/636,703

(22) Filed: Dec. 11, 2009

(65) Prior Publication Data
US 2011/0140247 A1 Jun. 16, 2011

(51) Int. Cl.
*H01L 21/50* (2006.01)
*H01L 21/44* (2006.01)
*H01L 23/02* (2006.01)
*H01L 23/552* (2006.01)
*H01L 23/52* (2006.01)

(52) U.S. Cl. ........ 438/109; 438/667; 257/686; 257/659; 257/660; 257/774

(58) Field of Classification Search .................. 438/109, 438/667; 257/686, 659, 660, 774
See application file for complete search history.

(56) References Cited

U.S. PATENT DOCUMENTS

| | | | |
|---|---|---|---|
| 6,489,676 B2 * | 12/2002 | Taniguchi et al. | 257/698 |
| 6,667,551 B2 * | 12/2003 | Hanaoka et al. | 257/750 |
| 6,774,467 B2 * | 8/2004 | Horiuchi et al. | 257/673 |
| 7,514,636 B2 * | 4/2009 | Sasaki | 174/252 |
| 7,550,857 B1 * | 6/2009 | Longo et al. | 257/777 |
| 7,618,846 B1 | 11/2009 | Pagaila et al. | |
| 7,633,765 B1 * | 12/2009 | Scanlan et al. | 361/760 |
| 7,885,081 B2 * | 2/2011 | Kawagishi et al. | 361/761 |
| 2003/0127704 A1 * | 7/2003 | Kobayashi et al. | 257/531 |
| 2007/0267725 A1 | 11/2007 | Lee et al. | |
| 2009/0134500 A1 | 5/2009 | Kuo | |
| 2009/0302435 A1 | 12/2009 | Pagaila et al. | |
| 2009/0302437 A1 | 12/2009 | Kim et al. | |

OTHER PUBLICATIONS

U.S. Appl. No. 12/329,778, filed Dec. 8, 2008, Lin et al.
U.S. Appl. No. 12/329,789, filed Dec. 8, 2008, Lin et al.

* cited by examiner

*Primary Examiner* — Luan C Thai
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a substrate assembly having a connection path; mounting a base device over the substrate assembly with a mount layer; mounting a stack device over the base device and having a stack die and a stack-organic-material; forming a stack-through-via in the stack-organic-material of the stack device and connected to the stack die and the substrate assembly; and applying a shield layer directly on a planarized surface of the stack-through-via partially exposed from the stack-organic-material.

20 Claims, 9 Drawing Sheets

INTEGRATED CIRCUIT PACKAGING SYSTEM WITH SHIELDED PACKAGE AND METHOD OF MANUFACTURE THEREOF

TECHNICAL FIELD

The present invention relates generally to an integrated circuit packaging system, and more particularly to a shielded package system.

BACKGROUND ART

It is very important for products to continue to improve in features, performance, and reliability while reducing product costs, product size, and equally important to be available quickly for purchase by the consumers or buyers. Products must compete in world markets and attract many consumers or buyers in order to be successful.

Electronic products such as cell phone base products, global positioning systems (GPS), satellites, communication equipment, consumer products, and a vast line of other similar products are in ever increasing global demand. Market growth for high density and high output/input integrated circuit packages has resulted in a trend for electronic products that are lightweight, smaller in size, multi-functional, and with ever increasing higher speeds.

Therefore, there is an important need that exists for parts in the package to become thinner and thinner to reduce the size of the whole package without sacrificing performance and speed.

Thus, an increasing need remains to reduce parts mounted on the circuit boards while increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate assembly having a connection path; mounting a base device over the substrate assembly with a mount layer; mounting a stack device over the base device and having a stack die and a stack-organic-material; forming a stack-through-via in the stack-organic-material of the stack device and connected to the stack die and the substrate assembly; and applying a shield layer directly on a planarized surface of the stack-through-via partially exposed from the stack-organic-material.

The present invention provides an integrated circuit packaging system including: a substrate assembly having a connection path; a base device over the substrate assembly with a mount layer; a stack device over the base device and having a stack die and a stack-organic-material; a stack-through-via formed in the stack-organic-material of the stack device and connected to the stack die and the substrate assembly; and; a shield layer directly on the stack-through-via having a substantially flat surface characteristic of a planarization process and partially exposed from the stack-organic-material.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
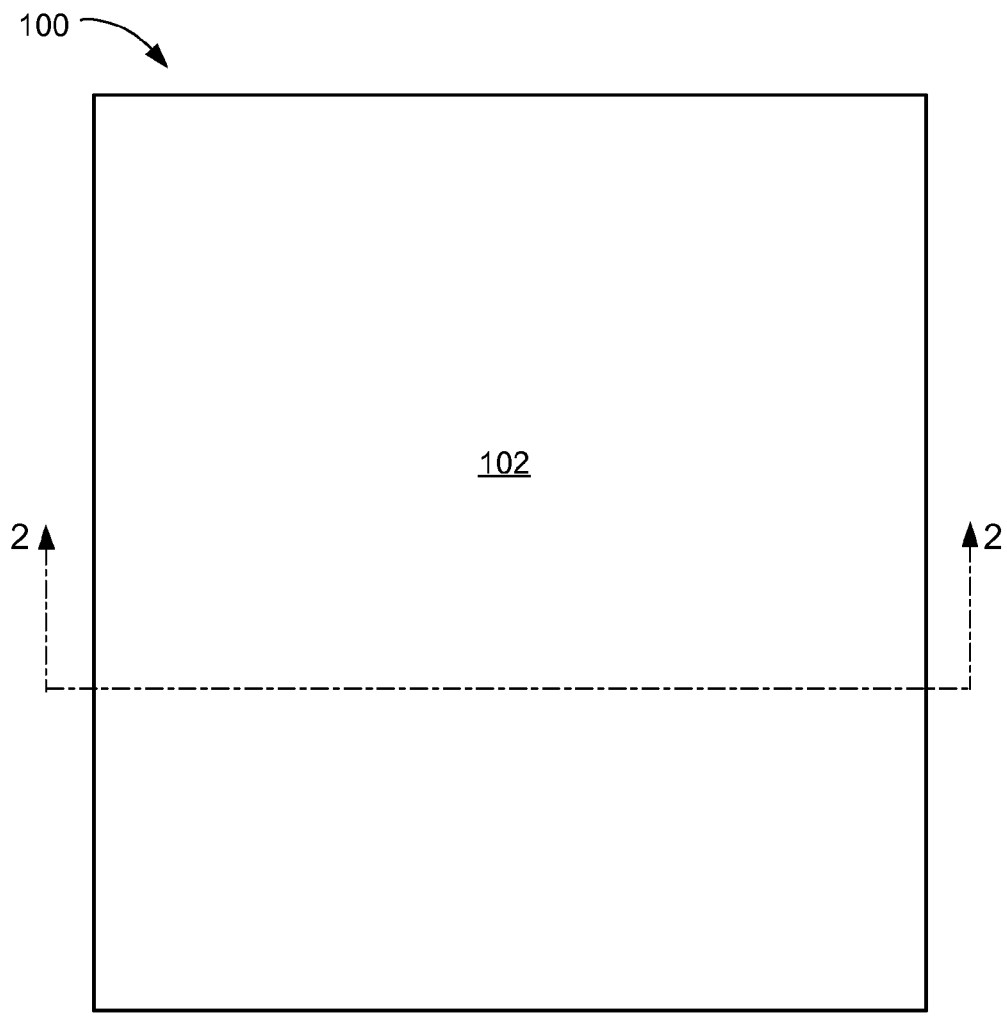
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. A shield layer 102 can be substantially exposed on top of the integrated circuit packaging system 100.

The shield layer 102 can be formed from an electrically conductive material such as a metal, a composite, or a resin capable of blocking transmission or reception of an electromagnetic, a radio frequency, or any specific circuit disruptive interference. The shield layer 102 can be formed with a planar shape and size greater than or equal to a planar shape and size of the overall dimensional length and dimensional width of the integrated circuit packaging system 100.

Figure 2:
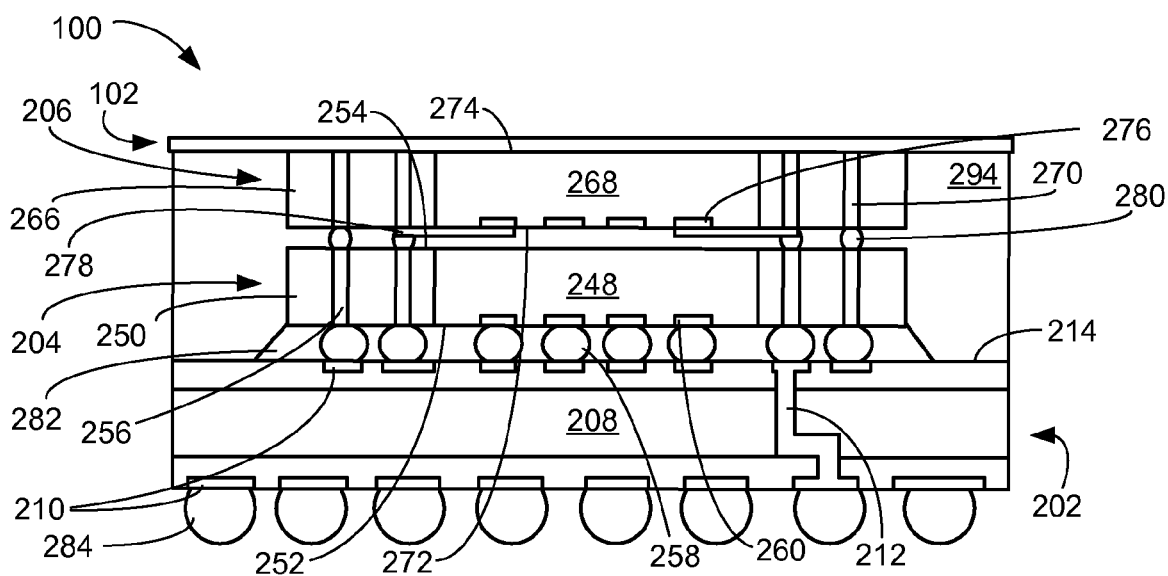
FIG. 2 is a cross-sectional view of the integrated circuit packaging system taken along a line 2-2 of FIG. 1.

Referring now to FIG. 2, therein is shown a cross-sectional view of the integrated circuit packaging system 100 taken along a line 2-2 of FIG. 1. The integrated circuit packaging system 100 can preferably include a substrate assembly 202, a base device 204, a stack device 206, and the shield layer 102.

The substrate assembly 202 can include a substrate 208 with substrate pads 210 exposed on an internal side 214 of the substrate assembly 202 and an external side opposite the internal side 214. Conductive material within the substrate 208 can be used to form connection paths 212, such as paths for ground, signal, power, thermal transfer, or a combination thereof, between the substrate pads 210.

The base device 204, such as an integrated circuit module, a wire bond chip, an internal stacking module, a bumped chip, a package, or an integrated circuit die, can include a base die 248, a base-organic-material 250, a first base side 252, and a second base side 254 opposite the first base side 252. Sides of the base die 248 intersecting the first base side 252 and the second base side 254 can preferably be surrounded and in contact with the base-organic-material 250, such as an organic polymer, an organic monomer, an organic copolymer, or an organic epoxy.

The base-organic-material 250 can extend horizontally away from the sides of the base die 248. A perimeter of the base device 204 can preferably be less than a perimeter of the substrate 208. The base-organic-material 250 can be vertically confined between the first base side 252 and the second base side 254 of the base device 204. The first base side 252, including an active side of the base die 248 and a bottom side of the base-organic-material 250, can be facing and mounted over the internal side 214 of the substrate assembly 202.

The base-organic-material 250 can include base-through-vias 256 having ends exposed on the first base side 252 and opposite ends exposed on the second base side 254. The base-through-vias 256 can have any size or shape. For example, a dimensional width of the base-through-vias 256 can be one third of a dimensional length of the base-through-vias 256 and formed having a profile shape of a cone.

Base device connectors 258, such as conductive balls, wires, or leads, can connect the end of the base-through-vias 256 exposed on the first base side 252 with the substrate pads 210. The base device connectors 258 can be used to connect base contact pads 260 exposed on the active side of the base die 248 with the substrate pads 210.

The stack device 206 can include a stack-organic-material 266, a stack die 268, and stack-through-vias 270 in a manner similar to the base device 204, the base-organic-material 250, the base die 248, and the base-through-vias 256. The stack-organic-material 266 can preferably include materials such as an organic polymer, an organic monomer, an organic copolymer, or an organic epoxy. The stack device 206 can include a first stack side 272 and a second stack side 274 opposite the first stack side 272. The first stack side 272, including the active side of the stack die 268 and a bottom side of the stack-organic-material 266, can be facing and mounted over the second base side 254 of the base device 204.

The stack die 268 can include the stack contact pads 276 in a manner similar to the base contact pads 260 of the base die 248. The stack contact pads 276 can be connected to ends of the stack-through-vias 270 exposed on an active side of the stack die 268 using planar conductors 278 such as re-distribution layers, traces, or wire in film connectors.

Stack device connectors 280, similar to the base device connectors 258, can be used to directly connect ends of the stack-through-vias 270 exposed on the first stack side 272 to the ends of the base-through-vias 256 exposed on the second base side 254. The stack device connectors 280 can also be used to directly connect the planar conductors 278 to the ends of the base-through-vias 256 exposed on the second base side 254.

The stack device connectors 280 can have any size or shape. For example, a dimensional width of the stack device connectors 280 can be four times a dimensional length of the stack device connectors 280 and formed having a shape of an ellipse.

A mount layer 282, such as an underfill, an adhesive, a sealant, a thermo-conductor, or combinations thereof, can be applied around the base device connectors 258. The substrate assembly 202 can optionally include system connectors 284, such as balls, pins, or leads, attached to the substrate pads 210 exposed on the external side of the substrate assembly 202. The system connectors 284 can provide connectivity between the integrated circuit packaging system 100 and a next level of integration.

An encapsulant 294 can be applied over the internal side 214 of the substrate assembly 202 and surround the mount layer 282, the base device 204, the stack device connectors 280, and the stack device 206. The second stack side 274 with exposed ends of the stack-through-vias 270 can be substantially exposed from the encapsulant 694.

The shield layer 102 can be mounted or deposited over the second stack side 274 and connected directly to ends 296 of the stack-through-vias 270 exposed on the second stack side 274. The ends 296 are substantially flat or planarized due to a planarization process that provides a large contact area for direct connection of the shield layer 102.

The combination of the shield layer 102, the stack-through-vias 270, the stack device connectors 280, the base-through-vias 256, the base device connectors 258, the connection paths 212, and the system connectors 284 can provide optimized electrical grounding shielding characteristics for the integrated circuit packaging system 100.

It has been discovered that the shield layer 102 with one or more of the stack-through-vias 270 eliminates transmission or reception of disruptive interference with improved connection paths such as grounding paths particularly with stacked IC dies.

It has been further discovered that the stack-through-vias 270 substantially eliminates ground loops.

Figure 3:
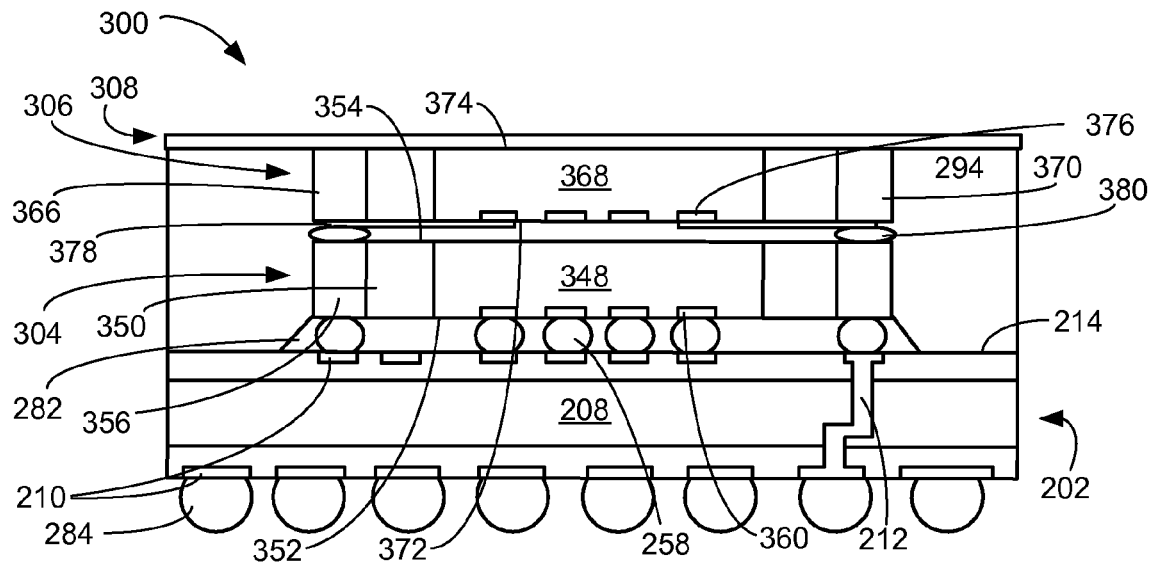
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can preferably include the substrate assembly 202, a base device 304, a stack device 306, and a shield layer 308. The substrate assembly 202 can include the substrate 208 with the connection paths 212 and the substrate pads 210.

The base device 304, such as an integrated circuit module, a wire bond chip, an internal stacking module, a bumped chip, a package, or an integrated circuit die, can include a base die 348, a base-organic-material 350, a first base side 352, and a second base side 354 opposite the first base side 352. Sides of the base die 348 intersecting the first base side 352 and the second base side 354 can preferably be surrounded and in contact with the base-organic-material 350 such as an organic polymer, an organic monomer, an organic copolymer, or an organic epoxy.

The base-organic-material 350 can extend horizontally away from the sides of the base die 348. A perimeter of the base device 304 can preferably be less than a perimeter of the substrate 208. The base-organic-material 350 can be vertically confined between the first base side 352 and the second base side 354 of the base device 304.

The base-organic-material 350 can include base-through-vias 356 having ends exposed on the first base side 352 and opposite ends exposed on the second base side 354. The base-through-vias 356 can be partially exposed from the base-organic-material 350 along an outer perimeter of the base device 304. The base-organic-material 350 can be oriented between and in contact with the base-through-vias 356 and the sides of the base die 348.

The first base side 352, including an active side of the base die 348 and a bottom side of the base-organic-material 350, can be facing and mounted over the internal side 214 of the substrate assembly 202. The base-through-vias 356 can have any size or shape. For example, a dimensional width of the base-through-vias 356 can be one third of a dimensional length of the base-through-vias 356 and formed having a profile shape of a wedge.

The base device connectors 258 can connect the end of the base-through-vias 356 exposed on the first base side 352 with the substrate pads 210. The base device connectors 258 can be used to connect base contact pads 360 exposed on the active side of the base die 348 with the substrate pads 210.

The stack device 306 can include a stack-organic-material 366, a stack die 368, and stack-through-vias 370 in a manner similar to the base device 304, the base-organic-material 350, the base die 348, and the base-through-vias 356. The stack-through-vias 370 can be partially exposed from the stack-organic-material 366 along an outer perimeter or sides of the stack device 306.

The stack device 306 can include a first stack side 372 and a second stack side 374 opposite the first stack side 372. The first stack side 372, including the active side of the stack die 368 and a bottom side of the stack-organic-material 366, can be facing and mounted over the second base side 354 of the base device 304.

The stack die 368 can include stack contact pads 376 in a manner similar to the base contact pads 360 of the base die 348. The stack contact pads 376 can be connected to ends of the stack-through-vias 370 exposed on an active side of the stack die 368 using planar conductors 378 such as re-distribution layers, traces, or wire in film connectors.

Stack device connectors 380, similar to the base device connectors 258, can be used to directly connect ends of the stack-through-vias 370 exposed on the first stack side 372 to the ends of the base-through-vias 356 exposed on the second base side 354. The stack device connectors 380 can also be used to directly connect the planar conductors 378 to the ends of the base-through-vias 356 exposed on the second base side 354.

The stack device connectors 380 can have any size or shape. For example, a dimensional width of the stack device connectors 380 can be four times a dimensional length of the stack device connectors 380 and formed having a shape of a circle. The mount layer 282 is shown applied around the base device connectors 258. The substrate assembly 202 can optionally include the system connectors 284 attached to the substrate pads 210 exposed on the external side of the substrate assembly 202.

The encapsulant 294 can be applied over the internal side 214 of the substrate assembly 202 and surround the mount layer 282, the base device 304, the stack device connectors 380, and the stack device 306. The second stack side 374 with exposed ends of the stack-through-vias 370 can be substantially exposed from the encapsulant 294.

The shield layer 308, similar to the shield layer 102 of FIG. 2, can be mounted or deposited over the second stack side 374 and connected directly to ends of the stack-through-vias 370 exposed on the second stack side 374. The shield layer 308 can block interference from an electro-magnetic, a radio frequency, or any specific circuit disruptive interference.

It has been discovered that the base-through-vias 356 and the stack-through-vias 370 having a portion of the sides exposed improves thermal properties, compatibility, retrofitability, and manufacturability, particularly with stacked IC dies.

Figure 4:
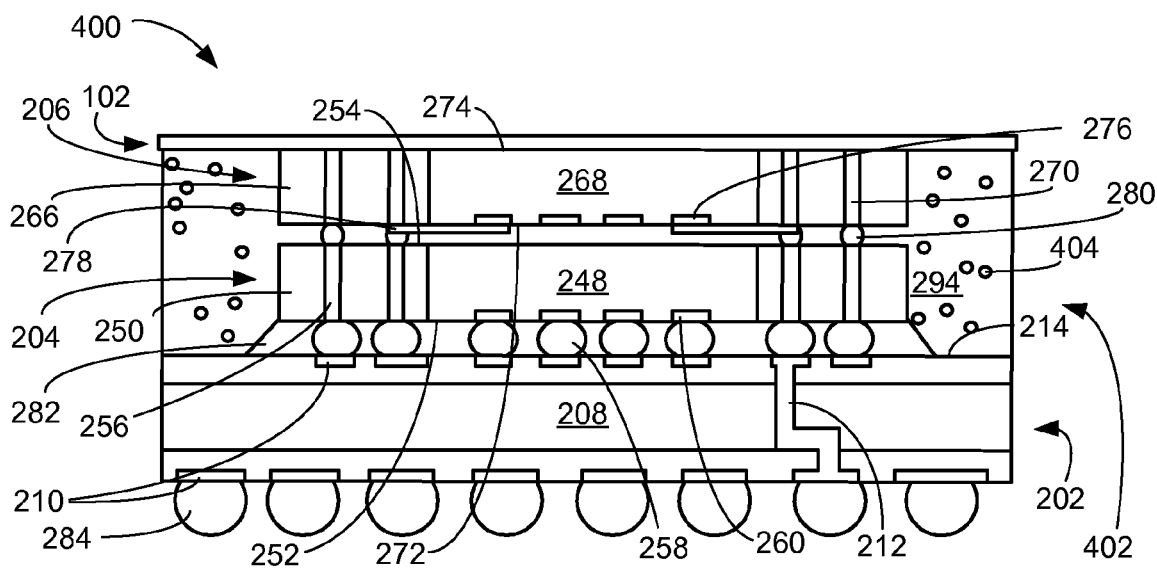
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can preferably include the substrate assembly 202, the base device 204, the stack device 206, and the shield layer 102. The substrate assembly 202 can include the substrate 208 with the connection paths 212 and the substrate pads 210.

The base device 204 can include the base die 248, the base-organic-material 250, the first base side 252, and the second base side 254. Sides of the base die 248 intersecting the first base side 252 and the second base side 254 can preferably be surrounded and in contact with the base-organic-material 250. The first base side 252 can be facing and mounted over the internal side 214 of the substrate assembly 202.

The base-organic-material 250 can include the base-through-vias 256. The base device connectors 258 can connect the end of the base-through-vias 256 exposed on the first base side 252 with the substrate pads 210. The base device connectors 258 can be used to connect the base contact pads 260 exposed on the active side of the base die 248 with the substrate pads 210.

The stack device 206 can include the stack-organic-material 266, the stack die 268, and the stack-through-vias 270 in a manner similar to the base device 204, the base-organic-material 250, the base die 248, and the base-through-vias 256. The stack device 206 can include the first stack side 272 and the second stack side 274. The first stack side 272, including the active side of the stack die 268 and the bottom side of the stack-organic-material 266, can be facing and mounted over the second base side 254 of the base device 204.

The stack die 268 can include the stack contact pads 276 in a manner similar to the base contact pads 260 of the base die 248. The stack contact pads 276 can to the ends of the stack-through-vias 270 exposed on the active side of the stack die 268 using the planar conductors 278.

The stack device connectors 280 can be used to directly connect ends of the stack-through-vias 270 exposed on the first stack side 272 to the ends of the base-through-vias 256 exposed on the second base side 254. The stack device connectors 280 can also be used to directly connect the planar conductors 278 to the ends of the base-through-vias 256 exposed on the second base side 254.

The mount layer 282 can be applied around the base device connectors 258. The substrate assembly 202 can optionally include the system connectors 284 attached to the substrate pads 210 exposed on the external side of the substrate assembly 202.

A horizontal barrier 402, exposed from the integrated circuit packaging system 400, can surround the sides of the base device 204, the sides of the stack device 206, and the mount layer 282. The horizontal barrier 402 can be formed from the encapsulant 294, a composite, or a resin with conductors or from an electrically conductive covering.

The horizontal barrier 402 can preferably be formed using the encapsulant 294 with embedded conductors 404 such as nickel, silver, or aluminum, or any combination of metals having similar interference blocking properties. The horizontal barrier 402 can block the transmission or reception of an electro-magnetic, a radio frequency, or any specific circuit disruptive interference.

The second stack side 274 with exposed ends of the stack-through-vias 270 can be substantially exposed from the horizontal barrier 402. The shield layer 102 can be mounted or deposited over the second stack side 274 and connected directly to ends of the stack-through-vias 270 exposed on the second stack side 274.

Figure 5:
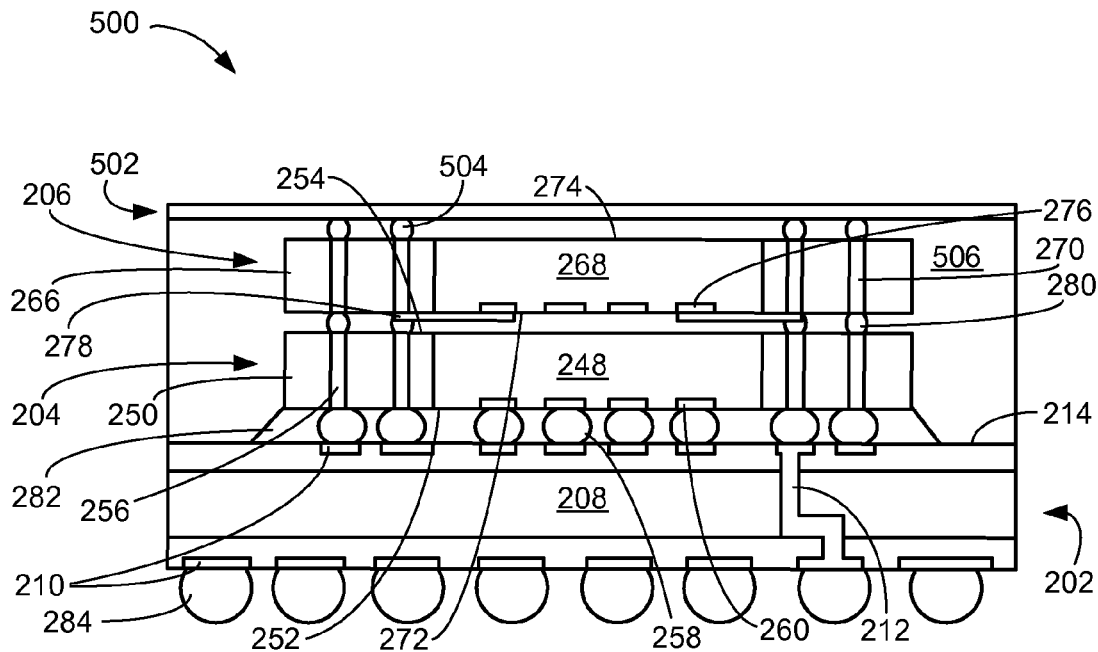
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 can preferably include the substrate assembly 202, the base device 204, the stack device 206, and a shield layer 502.

The substrate assembly 202 can include the substrate 208 with the substrate pads 210 and the conductive material within the substrate 208 to the form the connection paths 212. The base device 204 can include the base die 248, the base-organic-material 250, the first base side 252, and the second base side. The sides of the base die 248 can preferably be surrounded and in contact with the base-organic-material 250.

The base-organic-material 250 can include the base-through-vias 256 having ends exposed on the first base side 252 and opposite ends exposed on the second base side 254. The first base side 252, including an active side of the base die 248 and a bottom side of the base-organic-material 250, can be facing and mounted over the internal side of the substrate assembly 202.

The base device connectors 258 can connect the end of the base-through-vias 256 exposed on the first base side 252 with the substrate pads 210 exposed on the internal side of the substrate assembly 202. The base device connectors 258 can also be used to connect the base contact pads 260 exposed on the active side of the base die 248 with the substrate pads 210 exposed on the internal side of the substrate assembly 202.

The stack device 206 can include the stack-organic-material 266, the stack die 268, and the stack-through-vias 270 in a manner similar to the base device 204, the base-organic-material 250, the base die 248, and the base-through-vias 256. The stack device 206 can include the first stack side 272 and the second stack side 274 opposite the first stack side 272. The first stack side 272, including the active side of the stack die 268 and a bottom side of the stack-organic-material 266, can be facing and mounted over the second base side 254 of the base device 204.

The stack die 268 can include the stack contact pads 276 in a manner similar to the base contact pads 260 of the base die 248. The stack contact pads 276 can be connected to the ends of the stack-through-vias 270 exposed on an active side of the stack die 268 using the planar conductors 278 such as redistribution layers, traces, or wire in film connectors.

The stack device connectors 280 can be used to directly connect the ends of the stack-through-vias 270 exposed on the first stack side 272 to the ends of the base-through-vias 256 exposed on the second base side 254. The stack device connectors 280 can also be used to directly connect the planar conductors 278 to the ends of the base-through-vias 256 exposed on the second base side 254.

The mount layer 282 can be applied around the base device connectors 258. Conductive bumps 504, such as micro bumps, solder bumps, stacked bumps or conductive pillars, can be formed or attached on the stack-through-vias 270 exposed on the second stack side 274. An encapsulant 506, similar to the encapsulant 294 of FIG. 2, can be applied over the internal side of the substrate assembly 202 and surround the mount layer 282, the base device 204, the stack device connectors 280, the stack device 206. The encapsulant 506 can preferably cover the second stack side 274 with the conductive bumps 504, such as stacked bumps, solder bumps, micro bumps, conductive pillars, or combinations thereof.

The conductive bumps 504 can be substantially exposed from a side of the encapsulant 506 facing away from the second stack side 274. The shield layer 502, similar to the shield layer 102 of FIG. 2, can be mounted or deposited over the conductive bumps 504, connecting directly to the conductive bumps 504 exposed from the encapsulant 506.

The substrate assembly 202 can optionally include the system connectors 284, such as balls, pins, or leads, attached to the substrate pads 210 exposed on the external side of the substrate assembly 202. The system connectors 284 can provide connectivity between the integrated circuit packaging system 500 and a next level of integration.

Figure 6:
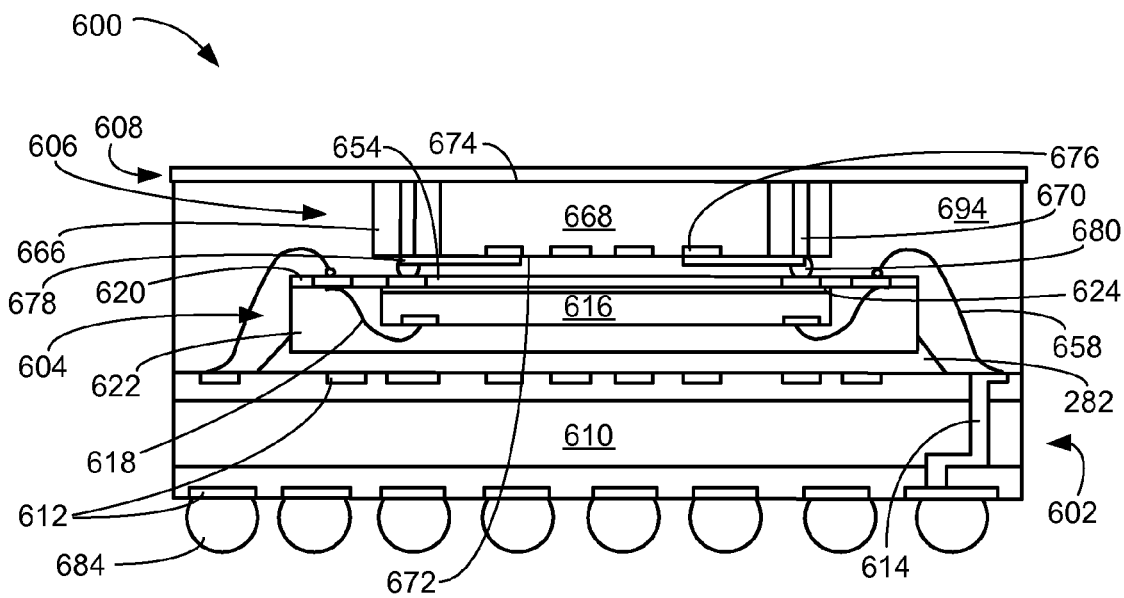
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 can preferably include a substrate assembly 602, a base device 604, a stack device 606, and a shield layer 608.

The substrate assembly 602 can include a substrate 610 with substrate pads 612 exposed on an internal side of the substrate assembly 602 and an external side opposite the internal side. Conductive material within the substrate 610 can be used to form connection paths 614, such as paths for ground, signal, power, thermal transfer, or a combination thereof, between the substrate pads 612.

The base device 604, such as a package, an internal stacking module, an integrated circuit module, a wire bond chip, a bumped chip, or an integrated circuit die, can include a component 616, chip connectors 618, a module substrate 620, and a package encapsulant 622 similar to the encapsulant 294 of FIG. 2.

The component 616, such as a wire bond chip, an integrated circuit die, a flip chip, or a combination thereof, can be mounted over a side of the module substrate 620 with an active side of the component 616 facing away from the module substrate 620. An adhesive layer 624, such as a film adhesive, an adhesive glue, or a combination thereof, can be used to attach the component 616 to the module substrate 620.

The active side of the component 616 can be connected to the side of the module substrate 620 attached to the component 616 using the chip connectors 618, such as bond wires, leads, or electrical conductors. The side of the module substrate 620 having the component 616 can be covered with the package encapsulant 622.

An exposed side of the package encapsulant 622 over the component 616 can be attached to the internal side of the substrate assembly 602 using the mount layer 282. A perimeter of a side of the module substrate 620 facing away from the substrate assembly 602 can be connected with the internal side of the substrate assembly 602 using base device connectors 658 such as wires, conductive balls, or leads.

The stack device 606, such as an integrated circuit module, a wire bond chip, an internal stacking module, a bumped chip, or an integrated circuit die, can be mounted over the base device 604. The stack device 606 can include a stack-organic-material 666, a stack die 668, stack-through-vias 670, a first stack side 672 of the stack device 606, and a second stack side 674 opposite the first stack side 672.

Sides of the stack die 668 intersecting the first stack side 672 and the second stack side 674 can preferably be surrounded and in contact with the stack-organic-material 666 such as an organic polymer, an organic monomer, an organic copolymer, or an organic epoxy. The stack-organic-material 666 can extend horizontally away from the sides of the stack die 668.

A perimeter of the stack device 606 can preferably be less than a perimeter of the base device 604. The stack-organic-material 666 can be vertically confined between the first stack side 672 and the second stack side 674 of the stack device 606. The first stack side 672, including the active side of the stack die 668 and a bottom side of the stack-organic-material 666, can be mounted and facing the base device 604.

The stack-organic-material 666 can include the stack-through-vias 670 having ends exposed on the first stack side 672 and opposite ends exposed on the second stack side 674. The stack-through-vias 670 can have any size or shape. For example, a dimensional width of the stack-through-vias 670 can be one third of a dimensional length of the stack-through-vias 670 and formed having a profile shape of a cone.

The stack die 668 can include stack contact pads 676 exposed on an active side of the stack die 668. The stack contact pads 676 can connect to ends of the stack-through-vias 670 exposed on the first stack side 672 of using planar conductors 678 such as re-distribution layers, traces, or wire in film connectors. Stack device connectors 680, such as conductive balls, wires, or leads, can be used to directly connect ends of the stack-through-vias 670 exposed on the first stack side 672 to the side of the module substrate 620 facing away from the package encapsulant 622.

The stack device connectors 680 can also be used to directly connect the planar conductors 678 to the side of the module substrate 620 facing away from the package encapsulant 622. The substrate assembly 602 can optionally include system connectors 684, such as balls, pins, or leads, attached to the substrate pads 612 exposed on the external side of the substrate assembly 602.

The encapsulant 694 can be applied over the internal side of the substrate assembly 602 and surround the mount layer 282, the base device 604, the stack device connectors 680, and the stack device 606. The second stack side 674 with exposed ends of the stack-through-vias 670 can be substantially exposed from the encapsulant 694.

The shield layer 608, formed from an electrically conductive material such as a metal, a composite, or a resin, can be mounted or deposited over the second stack side 674 and the encapsulant 694. The shield layer 608 can be connected directly to the ends of the stack-through-vias 670 exposed on the second stack side 674. The shield layer 608 can block interference from an electro-magnetic, a radio frequency, or any specific circuit disruptive interference.

Figure 7:
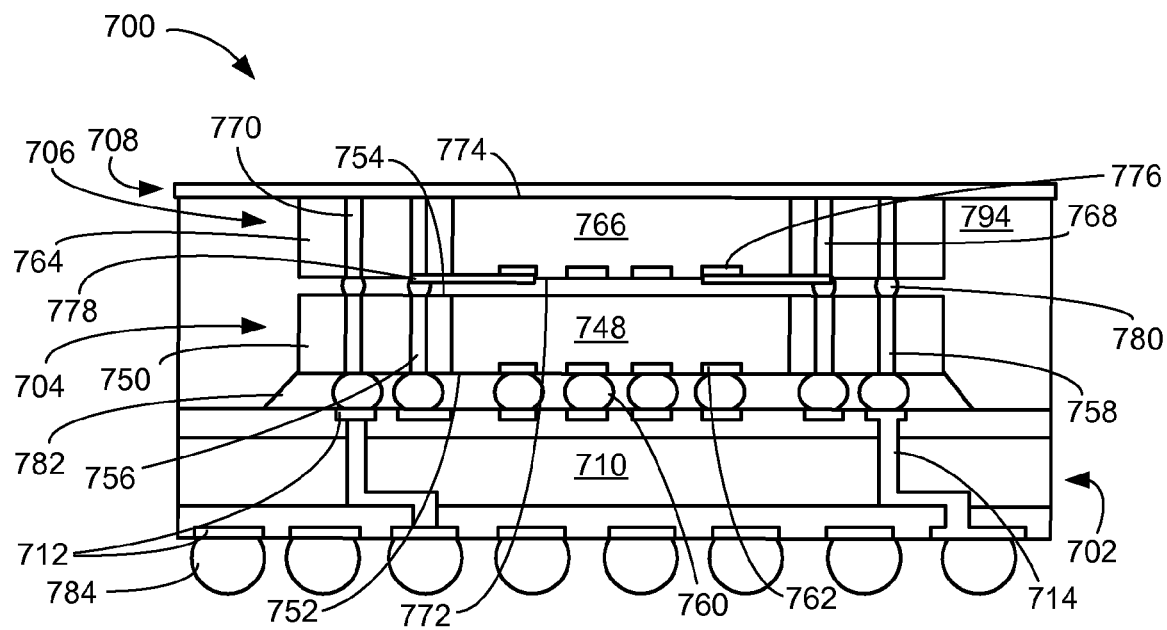
FIG. 7 is a cross-sectional view of an integrated circuit packaging system in a sixth embodiment of the present invention taken along line 7-7 of FIG. 8.
Figure 8:
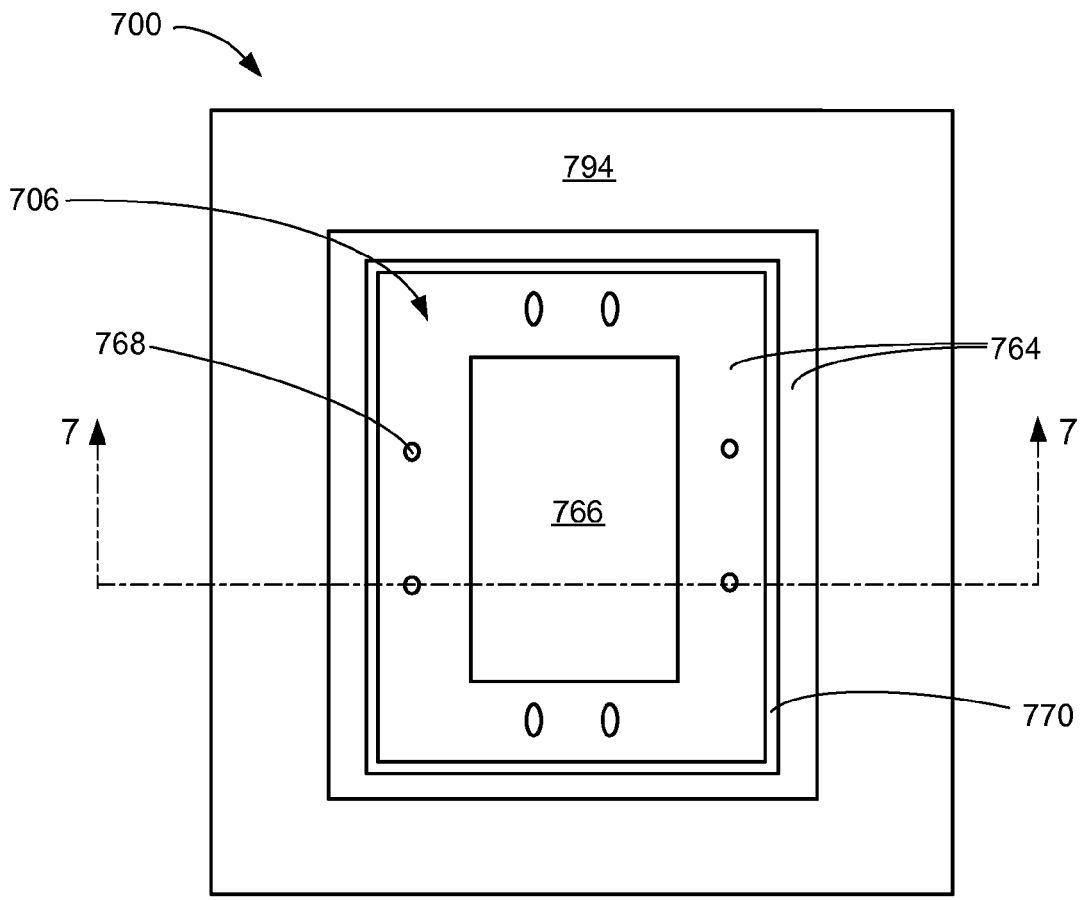
FIG. 8 is a top plan view of the integrated circuit packaging system of FIG. 7.

Referring now to FIG. 7, therein is shown a cross-sectional view of an integrated circuit packaging system 700 in a sixth embodiment of the present invention taken along line 7-7 of FIG. 8. The integrated circuit packaging system 700 can preferably include a substrate assembly 702, a base device 704, a stack device 706, and a shield layer 708.

The substrate assembly 702 can include a substrate 710 with substrate pads 712 exposed on an internal side of the substrate assembly 702 and an external side opposite the internal side. Conductive material within the substrate 710 can be used to form connection paths 714, such as paths for ground, signal, power, thermal transfer, or a combination thereof, between the substrate pads 712.

The base device 704, such as an integrated circuit module, a wire bond chip, an internal stacking module, a bumped chip, a package, or an integrated circuit die, can include a base die 748, a base-organic-material 750, a first base side 752, and a second base side 754 opposite the first base side 752. Sides of the base die 748 intersecting the first base side 752 and the second base side 754 can preferably be surrounded and in contact with the base-organic-material 750 such as an organic polymer, an organic monomer, an organic copolymer, or an organic epoxy.

The base-organic-material 750 can extend horizontally away from the sides of the base die 748. A perimeter of the base device 704 can preferably be less than a perimeter of the substrate 710. The base-organic-material 750 can be vertically confined between the first base side 752 and the second base side 754 of the base device 704.

The base-organic-material 750 can include base-through-vias 756 and a base shield border 758. The base-through-vias 756 can surround perimeter sides of the base die 748. The base-through-vias 756 can have ends exposed on the first base side 752 and opposite ends exposed on the second base side 754.

The base-through-vias 756 can have any size or shape. For example, a dimensional width of the base-through-vias 756 can be one third of a dimensional length of the base-through-vias 756 and formed having a profile shape of a cone.

The base shield border 758, such as a conductive band, fence, wall, or ring, can be formed completely around all of the base-through-vias 756. The base shield border 758 can completely separate the base-organic-material 750 into a portion outside a perimeter of the base shield border 758 and a portion of the base-organic-material 750 inside the perimeter of the shield border.

The portion of the base-organic-material 750 inside the perimeter of the base shield border 758 includes all of the base-through-vias 756. The base shield border 758 can have ends exposed on the first base side 752 and opposite ends exposed on the second base side 754.

The first base side 752, including an active side of the base die 748 and a bottom side of the base-organic-material 750, can be facing and mounted over the internal side of the substrate assembly 702. Base device connectors 760, such as conductive balls, wires, or leads, can connect the ends of the base-through-vias 756 exposed on the first base side 752 with the substrate pads 712.

The base device connectors 760 can also connect the ends of the base shield border 758 exposed on the first base side 752 with the substrate pads 712. The base contact pads 762 exposed on the active side of the base die 748 can be connected with the substrate pads 712 using the base device connectors 760.

The stack device 706 can include a stack-organic-material 764, a stack die 766, stack-through-vias 768, and a stack shield border 770 in a manner similar to the base device 704, the base-organic-material 750, the base die 748, the base-through-vias 756, and the base shield border 758. The stack device 706 can include a first stack side 772 and a second stack side 774 opposite the first stack side 772. The first stack side 772, including the active side of the stack die 766 and a bottom side of the stack-organic-material 764, can be facing and mounted over the second base side 754 of the base device 704.

The stack die 766 can include stack contact pads 776 in a manner similar to the base contact pads 762 of the base die 748. The stack contact pads 776 can be connected to ends of the stack-through-vias 768 exposed on an active side of the stack die 766 using planar conductors 778 such as re-distribution layers, traces, or wire in film connectors.

Stack device connectors 780, similar to the base device connectors 760, can be used to directly connect ends of the stack-through-vias 768 exposed on the first stack side 772 to the ends of the base-through-vias 756 exposed on the second base side 754. The stack device connectors 780 can be used to directly connect the planar conductors 778 to the ends of the base-through-vias 756 exposed on the second base side 754.

The stack device connectors 780 can also connect the ends of the stack shield border 770 exposed on the first stack side 772 with the ends of the base shield border 758 exposed on the second base side 754. The stack device connectors 780 can have any size or shape. For example, a dimensional width of the stack device connectors 780 can be four times a dimensional length of the stack device connectors 780 and formed having a shape of an ellipse.

A mount layer 782, such as an underfill, an adhesive, a sealant, a thermo-conductor, or combinations thereof, can be applied around the base device connectors 760. The substrate assembly 702 can optionally include system connectors 784, such as balls, pins, or leads, attached to the substrate pads 712 exposed on the external side of the substrate assembly 702. The system connectors 784 can provide connectivity between the integrated circuit packaging system 700 and a next level of integration.

An encapsulant 794 can be applied over the internal side of the substrate assembly 702 and surround the mount layer 782, the base device 704, the stack device connectors 780, and the stack device 706. The second stack side 774 with exposed ends of the stack-through-vias 768 can be substantially exposed from the encapsulant 694.

The shield layer 708 can be formed from an electrically conductive material such as a metal, a composite, or a resin. The shield layer 708 can block the transmission or reception of an electro-magnetic, a radio frequency, or any specific circuit disruptive interference.

The shield layer 708 can be mounted or deposited over the second stack side 774 and connected directly to ends of the stack-through-vias 768 exposed on the second stack side 774. The combination of the shield layer 708, the stack-through-vias 768, the stack device connectors 780, the base-through-vias 756, the base device connectors 760, the connection paths 714, and the system connectors 784 can provide optimized electrical grounding shielding characteristics for the integrated circuit packaging system 700.

Referring now to FIG. 8, therein is shown a top plan view of the integrated circuit packaging system 700 of FIG. 7. The shield layer 708 of FIG. 7 has been removed for clarity. The stack device 706 is shown surrounded by the encapsulant 794. The stack die 766 within the stack device 706 can be surrounded by the stack-organic-material 764.

The stack-through-vias 768 and the stack shield border 770 are shown exposed from the stack-organic-material 764. The stack shield border 770 can completely surround the stack die 766 and the stack-through-vias 768 to block circuit disruptive interference received or emitted.

For purposes of illustration, some of the stack-through-vias 768 are shown having a circular shape or an oval shape. The stack-through-vias 768 can have any shape or size and are not limited in the shape or size. The stack-through-vias 768 can preferably be formed or shaped to simplify manufacturing, improve performance, orientation, satisfy constraints, or reduce costs. The stack-through-vias 768 having the circular shape or the oval shape can preferably be used to simplify phases of manufacturing such as drilling, forming, filling, or reflowing phases.

Figure 9:
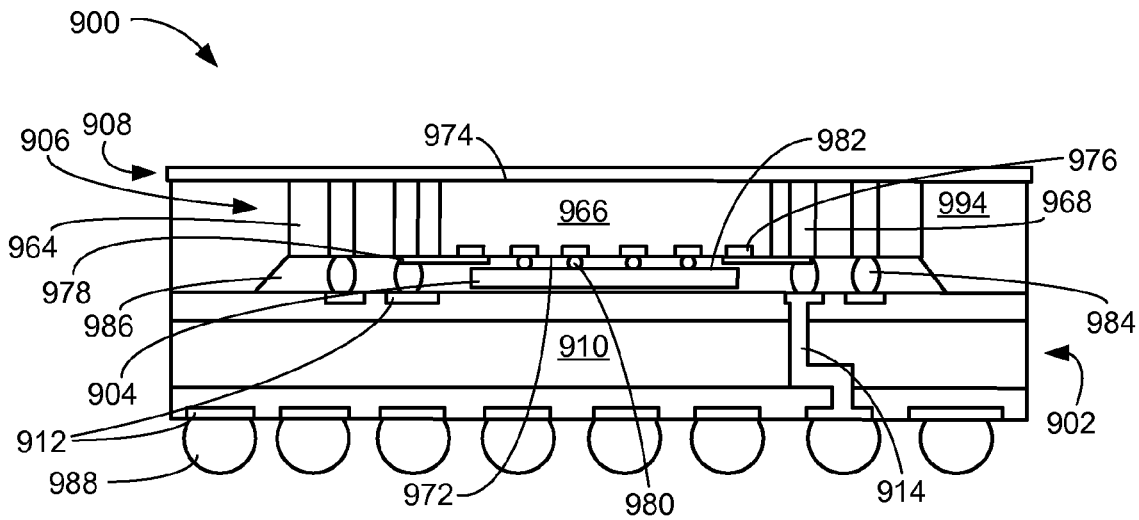
FIG. 9 is a cross-sectional view of an integrated circuit packaging system in a seventh embodiment of the present invention.

Referring now to FIG. 9, therein is shown a cross-sectional view of an integrated circuit packaging system 900 in a seventh embodiment of the present invention. The integrated circuit packaging system 900 can preferably include a substrate assembly 902, a base device 904, a stack device 906, and a shield layer 908.

The substrate assembly 902 can include a substrate 910 with substrate pads 912 exposed on an internal side of the substrate assembly 902 and an external side opposite the internal side. Conductive material within the substrate 910 can be used to form connection paths 914, such as paths for ground, signal, power, thermal transfer, or a combination thereof, between the substrate pads 912.

The stack device 906, such as an integrated circuit module, a wire bond chip, an internal stacking module, a bumped chip, or an integrated circuit die, can be mounted over the internal side of the substrate assembly 902. The stack device 906 can include a stack-organic-material 964, a stack die 966, and stack-through-vias 968. The stack device 906 can include a first stack side 972 and a second stack side 974 opposite the first stack side 972.

Sides of the stack die 966 intersecting the first stack side 972 and the second stack side 974 can preferably be surrounded with the stack-organic-material 964, such as an organic based thermoplastic, a thermosetting, an elastomer, or any polymer combination thereof. The sides of the stack die 966 can be in contact with the stack-organic-material 964.

The stack-organic-material 964 can extend horizontally away from the sides of the stack die 966. A perimeter of the stack die 966 can preferably be less than a perimeter of the substrate 910. The stack-organic-material 964 can be vertically confined between the first stack side 972 and the second stack side 974 of the stack device 906. The stack-organic-material 964 can include the stack-through-vias 968 having ends exposed on the first stack side 972 and opposite ends exposed on the second stack side 974.

The stack die 966 can include stack contact pads 976 exposed on an active side of the stack die 966. The stack contact pads 976 can be connected to ends of the stack-through-vias 968 exposed on an active side of the stack die 966 using planar conductors 978 such as re-distribution layers, traces, or wire in film connectors.

The stack die 966 can be connected to the base device 904, such as a bumped chip, an integrated circuit module, a wire bond chip, a package, an internal stacking module, or an integrated circuit die. Chip interconnects 980, such as conductive bumps, balls, or solder, can be used to connect the stack contact pads 976 to an active side 982 of the base device 904.

Stack device connectors 984, such as conductive balls, wires, or leads, can be used to directly connect ends of the stack-through-vias 968 exposed on the first stack side 972 to the substrate pads 912 exposed on the internal side of the substrate assembly 902. The stack device connectors 984 can also be used to directly connect the planar conductors 978 to the substrate pads 912 exposed on the internal side of the substrate assembly 902.

The stack device connectors 984 can have any size or shape. For example, a dimensional width of the stack device connectors 984 can be four times a dimensional length of the stack device connectors 984 and formed having a shape of an ellipse.

A mount layer 986, such as an underfill, an adhesive, a sealant, a thermo-conductor, or combinations thereof, can be applied between the stack device 906 and the internal side of the substrate assembly 902. The substrate assembly 902 can optionally include system connectors 988, such as balls, pins, or leads, attached to the substrate pads 912 exposed on the external side of the substrate assembly 902. The system connectors 988 can provide connectivity between the integrated circuit packaging system 900 and a next level of integration.

An encapsulant 994 can be applied over the internal side of the substrate assembly 902 and surround the mount layer 986, the base device 904, the chip interconnects 980, and the stack device 906. The second stack side 974 with exposed ends of the stack-through-vias 968 can be substantially exposed from the encapsulant 694.

The shield layer 908 can be formed from an electrically conductive material such as a metal, a composite, or a resin. The shield layer 908 can block the transmission or reception of an electro-magnetic, a radio frequency, or any specific circuit disruptive interference.

The shield layer 908 can be mounted or deposited over the second stack side 974 and connected directly to ends of the stack-through-vias 968 exposed on the second stack side 974. The combination of the shield layer 908, the stack-through-vias 968, the chip interconnects 980, the base-through-vias 956, the base device connectors 960, the connection paths 914, and the system connectors 988 can provide optimized electrical grounding shielding characteristics for the integrated circuit packaging system 900.

Figure 10:
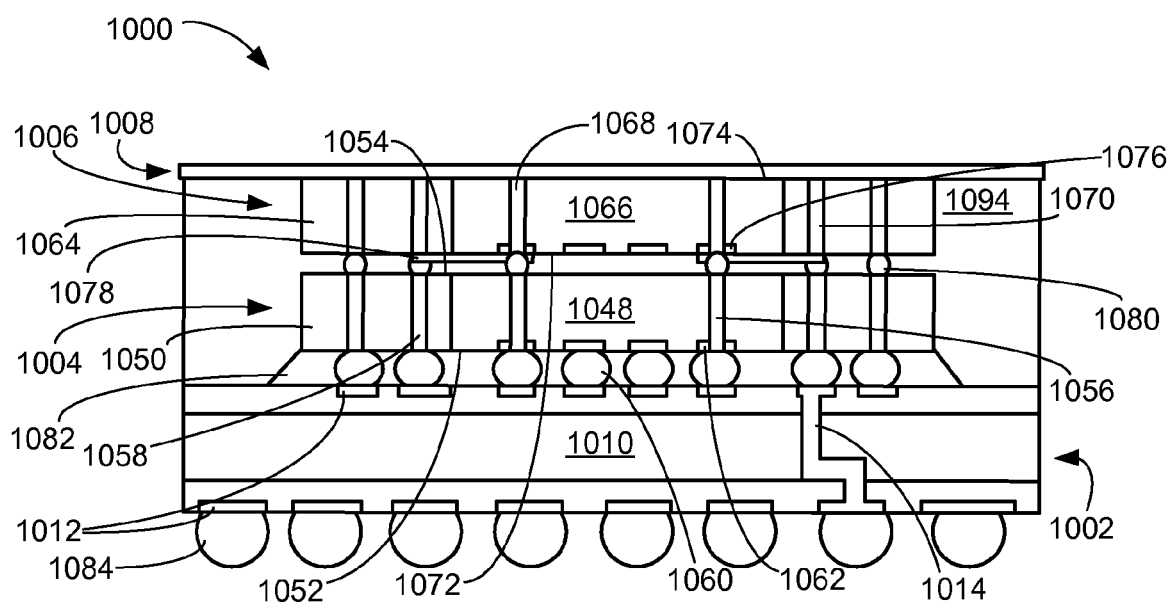
FIG. 10 is a cross-sectional view of an integrated circuit packaging system in an eighth embodiment of the present invention.

Referring now to FIG. 10, therein is shown a cross-sectional view of an integrated circuit packaging system 1000 in an eighth embodiment of the present invention. The integrated circuit packaging system 1000 can preferably include a substrate assembly 1002, a base device 1004, a stack device 1006, and a shield layer 1008.

The substrate assembly 1002 can include a substrate 1010 with substrate pads 1012 exposed on an internal side of the substrate assembly 1002 and an external side opposite the internal side. Conductive material within the substrate 1010 can be used to form connection paths 1014, such as paths for ground, signal, power, thermal transfer, or a combination thereof, between the substrate pads 1012.

The base device 1004, such as an integrated circuit module, a wire bond chip, an internal stacking module, a bumped chip, a package, or an integrated circuit die, can include a base die 1048, a base-organic-material 1050, a first base side 1052, and a second base side 1054 opposite the first base side 1052. Sides of the base die 1048 intersecting the first base side 1052 and the second base side 1054 can preferably be surrounded and in contact with the base-organic-material 1050, such as an organic based thermoplastic, a thermosetting, an elastomer, or any polymer combination thereof.

The base die 1048 can include base-through-silicon-vias 1056. The base-through-silicon-vias 1056 can have ends exposed on an active side of the base die 1048 coplanar with the first base side 1052 and opposite ends exposed a side of the base die 1048 coplanar with the second base side 1054. The base-through-silicon-vias 1056 preferably provide electrical connections at least partially through the base die 1048 from the active side of the base die 1048 to an opposite side of the base die 1048 to form a three-dimensional interconnection.

The base-through-silicon-vias 1056 can have any size or shape. For example, a dimensional width of the base-through-silicon-vias 1056 can be one-one thousandth of a dimensional length of the base-through-silicon-vias 1056 and formed having a profile shape of a column.

The base-organic-material 1050 can extend horizontally away from the sides of the base die 1048. A perimeter of the base device 1004 can preferably be less than a perimeter of the substrate 1010. The base-organic-material 1050 can be vertically confined between the first base side 1052 and the second base side 1054 of the base device 1004.

The base-organic-material 1050 can include base-through-vias 1058. The base-through-vias 1058 can surround perimeter sides of the base die 1048. The base-through-vias 1058 can have ends exposed on the first base side 1052 and opposite ends exposed on the second base side 1054.

The base-through-vias 1058 can have any size or shape. For example, a dimensional width of the base-through-vias 1058 can be one fifteenth of a dimensional length of the base-through-vias 1058 and formed having a profile shape of a cone.

The first base side 1052, including an active side of the base die 1048 and a bottom side of the base-organic-material 1050, can be facing and mounted over the internal side of the substrate assembly 1002. Base device connectors 1060, such as conductive balls, wires, or leads, can connect the ends of the base-through-vias 1058 exposed on the first base side 1052 with the substrate pads 1012.

The base device connectors 1060 can also connect the ends of the base-through-silicon-vias 1056 exposed on the first base side 1052 with the substrate pads 1012. The base contact pads 1062 exposed on the active side of the base die 1048 can be connected with the substrate pads 1012 using the base device connectors 1060.

The stack device 1006 can include a stack-organic-material 1064, a stack die 1066 with stack-through-silicon-vias 1068, and stack-through-vias 1070 in a manner similar to the base device 1004, the base-organic-material 1050, the base die 1048 with the base-through-silicon-vias 1056, and the base-through-vias 1058. The stack-through-silicon-vias 1068 preferably provide electrical connections at least partially through the stack die 1066 from the active side of the stack die 1066 to an opposite side of the stack die 1066 to form a three-dimensional interconnection.

The stack device 1006 can include a first stack side 1072 and a second stack side 1074 opposite the first stack side 1072. The first stack side 1072, including the active side of the stack die 1066 and a bottom side of the stack-organic-material 1064, can be facing and mounted over the second base side 1054 of the base device 1004.

The stack die 1066 can include stack contact pads 1076 and the stack-through-silicon-vias 1068 in a manner similar to the base contact pads 1062 and the base-through-silicon-vias 1056 of the base die 1048. The stack contact pads 1076 or the stack-through-silicon-vias 1068 can be connected to ends of the stack-through-vias 1070 exposed on an active side of the stack die 1066 using planar conductors 1078 such as re-distribution layers, traces, or wire in film connectors.

Stack device connectors 1080, similar to the base device connectors 1060, can be used to directly connect ends of the stack-through-vias 1070 exposed on the first stack side 1072 to the ends of the base-through-vias 1058 exposed on the second base side 1054. The stack device connectors 1080 can be used to directly connect the planar conductors 1078 or the stack-through-silicon-vias 1068 to the ends of the base-through-vias 1058 or the base-through-silicon-vias 1056 exposed on the second base side 1054.

The stack device connectors 1080 can also directly connect the ends of the stack-through-silicon-vias 1068 exposed on the first stack side 1072 or the stack contact pads 1076 with the ends of the base-through-silicon-vias 1056 exposed on the second base side 1054. The stack device connectors 1080 can have any size or shape. For example, a dimensional width of the stack device connectors 1080 can be four times a dimensional length of the stack device connectors 1080 and formed having a shape of an ellipse.

A mount layer 1082, such as an underfill, an adhesive, a sealant, a thermo-conductor, or combinations thereof, can be applied around the base device connectors 1060. The substrate assembly 1002 can optionally include system connectors 1084, such as balls, pins, or leads, attached to the substrate pads 1012 exposed on the external side of the substrate assembly 1002. The system connectors 1084 can provide connectivity between the integrated circuit packaging system 1000 and a next level of integration.

An encapsulant 1094 can be applied over the internal side of the substrate assembly 1002 and surround the mount layer 1082, the base device 1004, the stack device connectors 1080, and the stack device 1006. The second stack side 1074 with exposed ends of the stack-through-vias 1070 and the stack-through-silicon-vias 1068 can be substantially exposed from the encapsulant 694.

The shield layer 1008 can be formed from an electrically conductive material such as a metal, a composite, or a resin. The shield layer 1008 can block the transmission or reception of an electro-magnetic, a radio frequency, or any specific circuit disruptive interference.

The shield layer 1008 can be mounted or deposited over the second stack side 1074 and connected directly to ends of the stack-through-vias 1070 or the stack-through-silicon-vias 1068 exposed on the second stack side 1074. The combination of the shield layer 1008, the stack-through-vias 1070, the stack-through-silicon-vias 1068, the stack device connectors 1080, the base-through-vias 1058, the base-through-silicon-vias 1056, the base device connectors 1060, the connection paths 1014, and the system connectors 1084 can provide optimized electrical grounding shielding characteristics.

Figure 11:
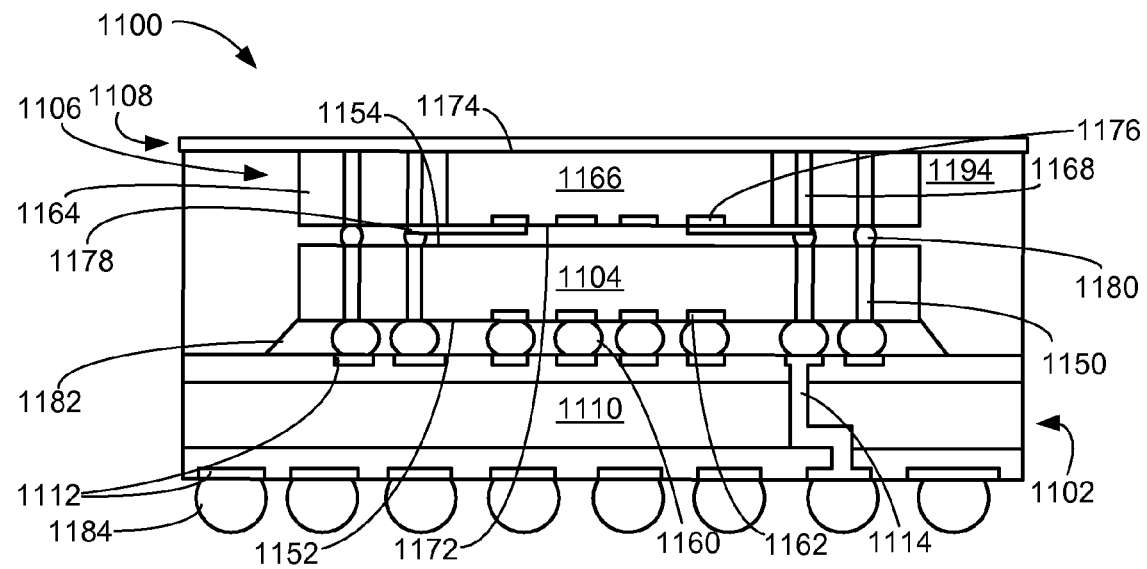
FIG. 11 is a cross-sectional view of an integrated circuit packaging system in a ninth embodiment of the present invention.

Referring now to FIG. 11, therein is shown a cross-sectional view of an integrated circuit packaging system 1100 in a ninth embodiment of the present invention. The integrated circuit packaging system 1100 can preferably include a substrate assembly 1102, a base device 1104, a stack device 1106, and a shield layer 1108.

The substrate assembly 1102 can include a substrate 1110 with substrate pads 1112 exposed on an internal side of the substrate assembly 1102 and an external side opposite the internal side. Conductive material within the substrate 1110 can be used to form connection paths 1114, such as paths for ground, signal, power, thermal transfer, or a combination thereof, between the substrate pads 1112.

The base device 1104, such as an integrated circuit die, a wire bond chip, an internal stacking module, a bumped chip, a package, or integrated circuit module, can include base-through-silicon-vias 1150, a first base side 1152, and a second base side 1154 opposite the first base side 1152.

A perimeter of the base device 1104 can preferably be less than a perimeter of the substrate 1110. The base-through-silicon-vias 1150 can have ends exposed on the first base side 1152 and opposite ends exposed on the second base side 1154. The base-through-silicon-vias 1150 preferably provide electrical connections at least partially through the base device 1104 from the first base side 1152 to the second base side 1154 to form a three-dimensional interconnection.

The base-through-silicon-vias 1150 can have any size or shape. For example, a dimensional width of the base-through-silicon-vias 1150 can be one eighth of a dimensional length of the base-through-silicon-vias 1150 and formed having a profile shape of a cone.

The first base side 1152 can be facing and mounted over the internal side of the substrate assembly 1102. Base device connectors 1160, such as conductive balls, wires, or leads, can connect the ends of the base-through-silicon-vias 1150 exposed on the first base side 1152 with the substrate pads 1112. The base contact pads 1162 exposed on the active side of the base device 1104 can be connected with the substrate pads 1112 using the base device connectors 1160.

The stack device 1106, such as an integrated circuit module, a wire bond chip, an internal stacking module, a bumped chip, or an integrated circuit die, can be mounted over the base device 1104. The stack device 1106 can include a stack-organic-material 1164, a stack die 1166, and stack-through-vias 1168.

The stack device 1106 can include a first stack side 1172 and a second stack side 1174 opposite the first stack side 1172. The first stack side 1172, including an active side of the stack die 1166 and a bottom side of the stack-organic-material 1164, can be facing and mounted over the second base side 1154.

Sides of the stack die 1166 intersecting the first stack side 1172 and the second stack side 1174 can preferably be surrounded with the stack-organic-material 1164, such as an organic based thermoplastic, a thermosetting, an elastomer, or any polymer combination thereof. The sides of the stack die 1166 can be in contact with the stack-organic-material 1164.

The stack-organic-material 1164 can extend horizontally away from the sides of the stack die 1166. A perimeter of the stack die 1166 can preferably be less than a perimeter of the substrate 1110. The stack-organic-material 1164 can be vertically confined between the first stack side 1172 and the second stack side 1174 of the stack device 1106.

The stack-organic-material 1164 can include the stack-through-vias 1168 having ends exposed on the first stack side 1172 and opposite ends exposed on the second stack side 1174. The stack die 1166 can include stack contact pads 1176 exposed on an active side of the stack die 1166.

The stack contact pads 1176 can be connected to ends of the stack-through-vias 1168 exposed on the first stack side 1172 using planar conductors 1178 such as re-distribution layers, traces, or wire in film connectors. The stack-through-vias 1168 exposed on the first stack side 1172 can be connected to the base-through-silicon-vias 1150 exposed on the second base side 1154 using stack device connectors 1180.

The stack device connectors 1180, such as conductive bumps, balls, or solder, can also be used to connect the planar conductors 1178 to the base-through-silicon-vias 1150 exposed on the second base side 1154. The stack device connectors 1180 can have any size or shape.

A mount layer 1182, such as an underfill, an adhesive, a sealant, a thermo-conductor, or combinations thereof, can be applied around the base device connectors 1160. The substrate assembly 1102 can optionally include system connectors 1184, such as balls, pins, or leads, attached to the substrate pads 1112 exposed on the external side of the substrate assembly 1102. The system connectors 1184 can provide connectivity between the integrated circuit packaging system 1100 and a next level of integration.

An encapsulant 1194 can be applied over the internal side of the substrate assembly 1102 and surround the mount layer 1182, the base device 1104, the stack device connectors 1180, and the stack device 1106. The second stack side 1174 with exposed ends of the stack-through-vias 1168 can be substantially exposed from the encapsulant 694.

The shield layer 1108 can be formed from an electrically conductive material such as a metal, a composite, or a resin. The shield layer 1108 can block the transmission or reception of an electro-magnetic, a radio frequency, or any specific circuit disruptive interference.

The shield layer 1108 can be mounted or deposited over the second stack side 1174 and connected directly to ends of the stack-through-vias 1168 exposed on the second stack side 1174. The combination of the shield layer 1108, the stack-through-vias 1168, the stack device connectors 1180, the base-through-vias 1156, the base device connectors 1160, the connection paths 1114, and the system connectors 1184 can provide optimized electrical grounding shielding characteristics for the integrated circuit packaging system 1100.

Figure 12:
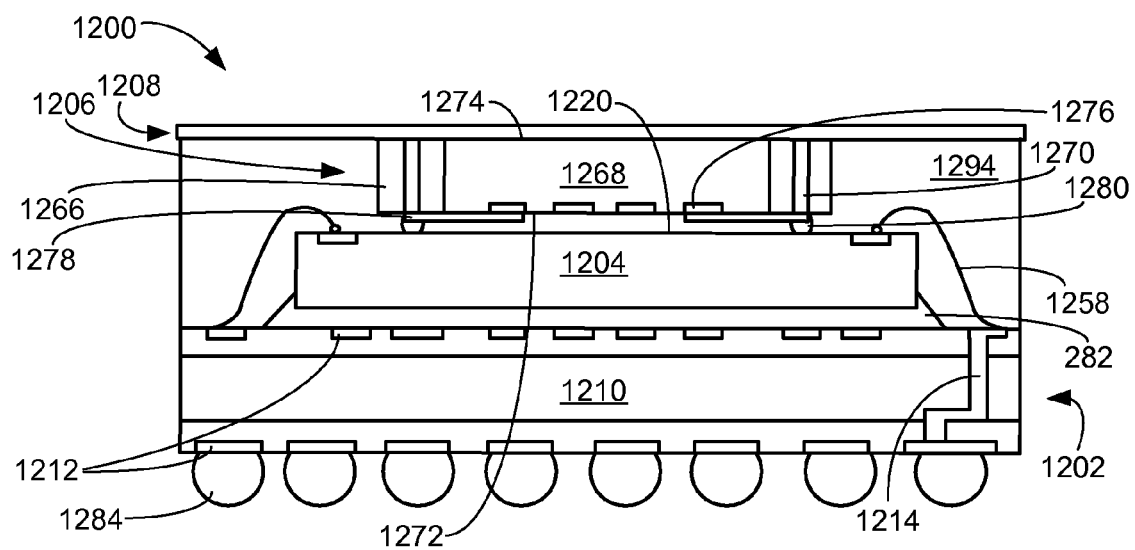
FIG. 12 is a cross-sectional view of an integrated circuit packaging system in a tenth embodiment of the present invention.

Referring now to FIG. 12, therein is shown a cross-sectional view of an integrated circuit packaging system 1200 in a tenth embodiment of the present invention. The integrated circuit packaging system 1200 can preferably include a substrate assembly 1202, a base device 1204, a stack device 1206, and a shield layer 1208.

The substrate assembly 1202 can include a substrate 1210 with substrate pads 1212 exposed on an internal side of the substrate assembly 1202 and an external side opposite the internal side. Conductive material within the substrate 1210 can be used to form connection paths 1214, such as paths for ground, signal, power, thermal transfer, or a combination thereof, between the substrate pads 1212.

The base device 1204, such as a wire bond chip, an internal stacking module, an integrated circuit module, a bumped chip, a package, or an integrated circuit die, can be mounted over the internal side of the substrate assembly 1202. A side opposite an active side 1220 of the base device 1204 can be attached to the internal side using the mount layer 282.

A perimeter of the active side 1220 of the base device 1204 can be connected with the internal side of the substrate assembly 1202 using base device connectors 1258, such as wires, conductive balls, or leads. The stack device 1206, such as an integrated circuit module, a wire bond chip, an internal stacking module, a bumped chip, or an integrated circuit die, can be mounted over the base device 1204.

The stack device 1206 can include a stack-organic-material 1266, a stack die 1268, stack-through-vias 1270, a first stack side 1272 of the stack device 1206, and a second stack side 1274 opposite the first stack side 1272. Sides of the stack die 1268 intersecting the first stack side 1272 and the second stack side 1274 can preferably be surrounded and in contact with the stack-organic-material 1266 such as an organic polymer, an organic monomer, an organic copolymer, or an organic epoxy. The stack-organic-material 1266 can extend horizontally away from the sides of the stack die 1268.

A perimeter of the stack device 1206 can preferably be less than a perimeter of the base device 1204. The stack-organic-material 1266 can be vertically confined between the first stack side 1272 and the second stack side 1274 of the stack device 1206. The first stack side 1272, including the active side of the stack die 1268 and a bottom side of the stack-organic-material 1266, can be mounted and facing the base device 1204.

The stack-organic-material 1266 can be formed with the stack-through-vias 1270 having ends exposed on the first stack side 1272 and opposite ends exposed on the second stack side 1274. The stack-through-vias 1270 can have any size or shape. For example, a dimensional width of the stack-through-vias 1270 can be one tenth of a dimensional length of the stack-through-vias 1270 and formed having a profile shape of a column.

The stack die 1268 can include stack contact pads 1276 exposed on an active side of the stack die 1268. The stack contact pads 1276 can connect to ends of the stack-through-vias 1270 exposed on the first stack side 1272 of using planar conductors 1278 such as re-distribution layers, traces, or wire in film connectors.

Stack device connectors 1280, such as conductive balls, wires, or leads, can be used to directly connect ends of the stack-through-vias 1270 exposed on the first stack side 1272 to the active side 1220 of the base device 1204. The stack device connectors 1280 can also be used to directly connect the planar conductors 1278 to the active side 1220 of the base device 1204. The substrate assembly 1202 can optionally include system connectors 1284, such as balls, pins, or leads, attached to the substrate pads 1212 exposed on the external side of the substrate assembly 1202.

An encapsulant 1294 can be applied over the internal side of the substrate assembly 1202 and surround the mount layer 282, the base device 1204, the stack device connectors 1280, the base device connectors 1258, and the stack device 1206. The second stack side 1274 with exposed ends of the stack-through-vias 1270 can be substantially exposed from the encapsulant 1294.

The shield layer 1208, formed from an electrically conductive material such as a metal, a composite, or a resin, can be mounted or deposited over the second stack side 1274 and the encapsulant 1294. The shield layer 1208 can be connected directly to the ends of the stack-through-vias 1270 exposed on the second stack side 1274. The shield layer 1208 can block interference from an electro-magnetic, a radio frequency, or any specific circuit disruptive interference.

Figure 13:
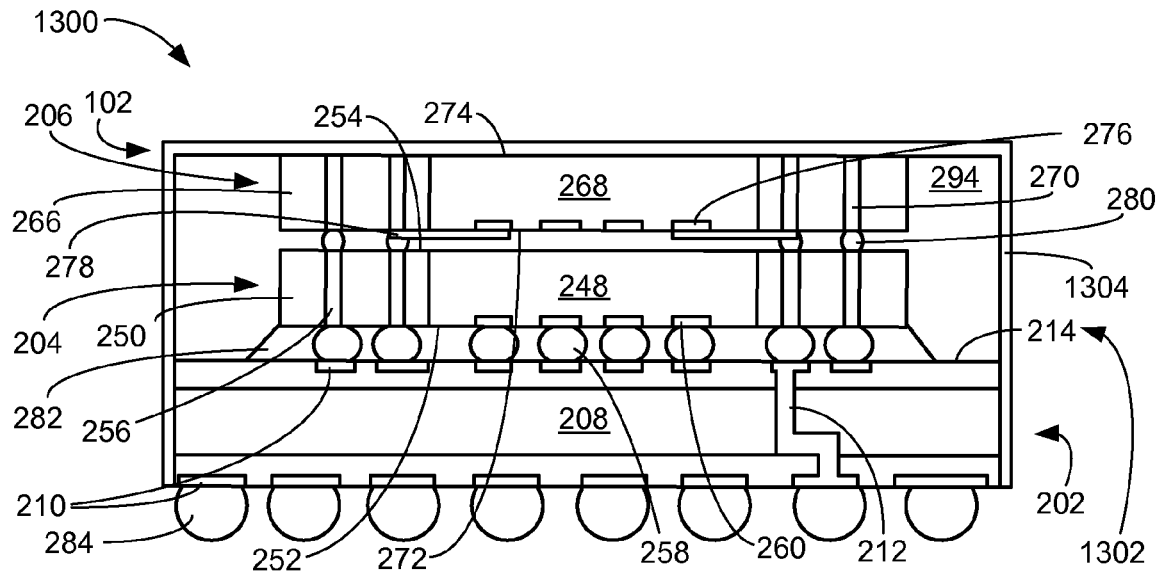
FIG. 13 is a cross-sectional view of an integrated circuit packaging system in an eleventh embodiment of the present invention.

Referring now to FIG. 13, therein is shown a cross-sectional view of an integrated circuit packaging system 1300 in an eleventh embodiment of the present invention. The integrated circuit packaging system 1300 can preferably include the substrate assembly 202, the base device 204, the stack device 206, and the shield layer 102. The substrate assembly 202 can include the substrate 208 with the connection paths 212 and the substrate pads 210.

The base device 204 can include the base die 248, the base-organic-material 250, the first base side 252, and the second base side 254. Sides of the base die 248 intersecting the first base side 252 and the second base side 254 can preferably be surrounded and in contact with the base-organic-material 250. The base-organic-material 250 can include the base-through-vias 256. The first base side 252 can be facing and mounted over the internal side 214 of the substrate assembly 202.

The base device connectors 258 can connect the end of the base-through-vias 256 exposed on the first base side 252 with the substrate pads 210. The base device connectors 258 can be used to connect the base contact pads 260 exposed on the active side of the base die 248 with the substrate pads 210.

The stack device 206 can include the stack-organic-material 266, the stack die 268, and the stack-through-vias 270 in a manner similar to the base device 204, the base-organic-material 250, the base die 248, and the base-through-vias 256. The stack device 206 can include the first stack side 272 and the second stack side 274. The first stack side 272, including the active side of the stack die 268 and the bottom side of the stack-organic-material 266, can be facing and mounted over the second base side 254 of the base device 204.

The stack die 268 can include the stack contact pads 276 in a manner similar to the base contact pads 260 of the base die 248. The stack contact pads 276 can be connected to the ends of the stack-through-vias 270 exposed on the active side of the stack die 268 using the planar conductors 278.

The stack device connectors 280 can be used to directly connect ends of the stack-through-vias 270 exposed on the first stack side 272 to the ends of the base-through-vias 256 exposed on the second base side 254. The stack device connectors 280 can also be used to directly connect the planar conductors 278 to the ends of the base-through-vias 256 exposed on the second base side 254.

The mount layer 282 can be applied around the base device connectors 258. The substrate assembly 202 can optionally include the system connectors 284 attached to the substrate pads 210 exposed on the external side of the substrate assembly 202. The encapsulant 294 can be applied over the internal side 214 of the substrate assembly 202 and surround the mount layer 282, the base device 204, the stack device connectors 280, and the stack device 206.

The second stack side 274 with exposed ends of the stack-through-vias 270 can be substantially exposed from the encapsulant 294. The shield layer 102 can be mounted or deposited over the second stack side 274 and connected directly to ends of the stack-through-vias 270 exposed on the second stack side 274.

A horizontal barrier 1302, exposed from the integrated circuit packaging system 1300, can surround the substrate assembly 202 and the encapsulant 294 including the sides of the base device 204, the sides of the stack device 206, and the mount layer 282. The horizontal barrier 1302 can be formed from an electrically conductive covering 1304 or from the encapsulant 294, a composite, or a resin with conductors.

The horizontal barrier 1302 can preferably be formed using the electrically conductive covering 1304 similar to the shield layer 102. The horizontal barrier 1302 can connect an edge of the shield layer 102 with the side of the substrate 208 having the system connectors 284.

Figure 14:
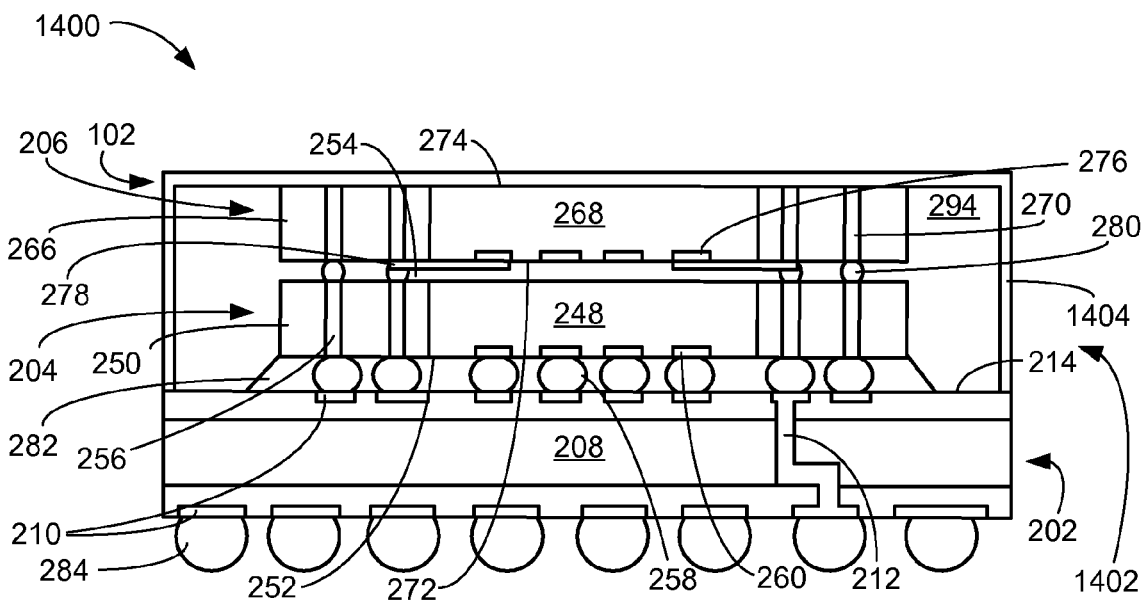
FIG. 14 is a cross-sectional view of an integrated circuit packaging system in a twelfth embodiment of the present invention.

Referring now to FIG. 14, therein is shown a cross-sectional view of an integrated circuit packaging system in a twelfth embodiment of the present invention. The integrated circuit packaging system 1400 can preferably include the substrate assembly 202, the base device 204, the stack device 206, and the shield layer 102. The substrate assembly 202 can include the substrate 208 with the connection paths 212 and the substrate pads 210.

The base device 204 can include the base die 248, the base-organic-material 250, the first base side 252, and the second base side 254. Sides of the base die 248 intersecting the first base side 252 and the second base side 254 can preferably be surrounded and in contact with the base-organic-material 250. The base-organic-material 250 can include the base-through-vias 256. The first base side 252 can be facing and mounted over the internal side 214 of the substrate assembly 202.

The base device connectors 258 can connect the end of the base-through-vias 256 exposed on the first base side 252 with the substrate pads 210. The base device connectors 258 can be used to connect the base contact pads 260 exposed on the active side of the base die 248 with the substrate pads 210.

The stack device 206 can include the stack-organic-material 266, the stack die 268, and the stack-through-vias 270 in a manner similar to the base device 204, the base-organic-material 250, the base die 248, and the base-through-vias 256. The stack device 206 can include the first stack side 272 and the second stack side 274. The first stack side 272, including the active side of the stack die 268 and the bottom side of the stack-organic-material 266, can be facing and mounted over the second base side 254 of the base device 204.

The stack die 268 can include the stack contact pads 276 in a manner similar to the base contact pads 260 of the base die 248. The stack contact pads 276 can be connected to the ends of the stack-through-vias 270 exposed on the active side of the stack die 268 using the planar conductors 278.

The stack device connectors 280 can be used to directly connect ends of the stack-through-vias 270 exposed on the first stack side 272 to the ends of the base-through-vias 256 exposed on the second base side 254. The stack device connectors 280 can also be used to directly connect the planar conductors 278 to the ends of the base-through-vias 256 exposed on the second base side 254.

The mount layer 282 can be applied around the base device connectors 258. The substrate assembly 202 can optionally include the system connectors 284 attached to the substrate pads 210 exposed on the external side of the substrate assembly 202. The encapsulant 294 can be applied over the internal side 214 of the substrate assembly 202 and surround the mount layer 282, the base device 204, the stack device connectors 280, and the stack device 206.

The second stack side 274 with exposed ends of the stack-through-vias 270 can be substantially exposed from the encapsulant 294. The shield layer 102 can be mounted or deposited over the second stack side 274 and connected directly to ends of the stack-through-vias 270 exposed on the second stack side 274.

A horizontal barrier 1402, exposed from the integrated circuit packaging system 1400, can surround the encapsulant 294. The horizontal barrier 1402 can be formed from an electrically conductive covering 1404 or from the encapsulant 294, a composite, or a resin with conductors.

The horizontal barrier 1402 can preferably be formed using the electrically conductive covering 1404 similar to the shield layer 102. The horizontal barrier 1402 can connect an edge of the shield layer 102 with the side of the substrate 208 opposite the side of the substrate 208 having the system connectors 284.

Figure 15:
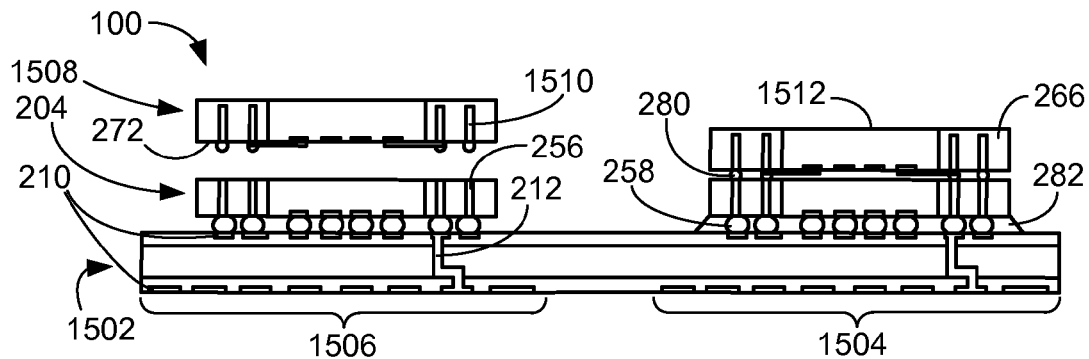
FIG. 15 is a cross-sectional view of the integrated circuit packaging system of FIG. 2 during an assembly mounting and underfilling phase of manufacturing.

Referring now to FIG. 15, therein is shown a cross-sectional view of the integrated circuit packaging system of FIG. 2 during an assembly mounting and underfilling phase of manufacturing. Shown is a dual substrate 1502 having a first build site 1504 and a second build site 1506.

For illustrative purposes, the first build site 1504 and the second build site 1506 of the dual substrate 1502 can each be used to build and fabricate an identical copy of the integrated circuit packaging system 100 of FIG. 2. The processes and descriptions that follow can apply to either the first build site 1504 or the second build site 1506 as shown in FIG. 15 through FIG. 19. It is noted, that the first build site 1504 and the second build site 1506 can optionally be different.

The conductive material within the dual substrate 1502 can be used to form the connection paths 212 between the substrate pads 210 using a substrate building process such as masking, etching, plating, laminating, or a combination thereof. The base-through-vias 256 of the base device 204 can be mounted and attached to the substrate pads 210 of the substrate using the base device connectors 258 and a connecting process such as a solder reflow process with convection heating, sonic heating, laser energy, or a combination thereof.

An early stack device 1508, similar to the stack device 206 of FIG. 2, except formed having partial or blind vias 1510 from the first stack side 272 into a portion of the stack-organic-material 266 and terminated below a sacrificial surface 1512 of the stack-organic-material 266 and of the early stack device 1508. The early stack device 1508 can preferably have a thickness greater than the thickness of the stack device 206.

Ends of the partial or blind vias 1510 exposed on the first stack side 272 can be mounted and attached to the base-through-vias 256 using the stack device connectors 280 and the connecting process. The mount layer 282 can be applied around the base device connectors 258 between the base device 204 and the dual substrate 1502 using a filling process such as injecting, reflowing, molding, or a process combination thereof.

It has been discovered that the partial or blind vias 1510 reduce size, reduce costs, improve durability, and improve structural integrity particularly with stacked IC dies.

Figure 16:
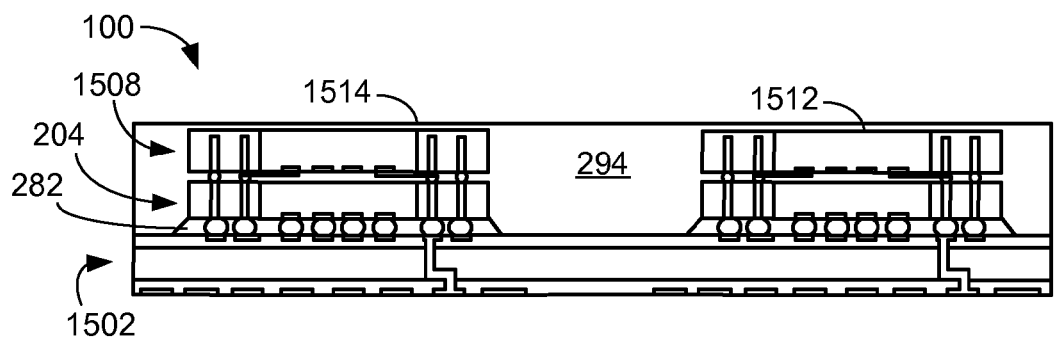
FIG. 16 is the structure of FIG. 15 in an encapsulation phase of the assembly.

Referring now to FIG. 16, therein is shown the structure of FIG. 15 in an encapsulation phase of the assembly. The early stack device 1508, the base device 204, the mount layer 282, and a side of the dual substrate 1502 having the mount layer 282 can be covered with the encapsulant 294 using an encapsulation process. The sacrificial surface 1512 can optionally be fully or partially covered by a top layer 1514 of the encapsulant 294.

Figure 17:
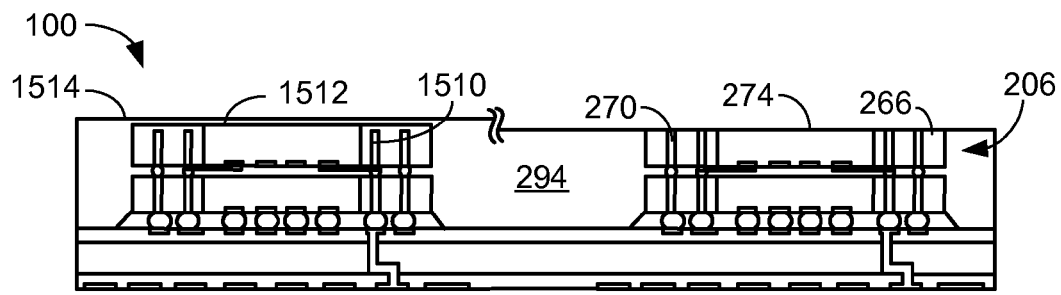
FIG. 17 is the structure of FIG. 16 in a removal phase of a portion of the assembly.

Referring now to FIG. 17, therein is shown the structure of FIG. 16 in a removal phase of a portion of the assembly. The sacrificial surface 1512 or the top layer 1514 of the encapsulant 294 can be removed using a removal process to expose ends of the partial or blind vias 1510 closest to the sacrificial surface 1512 resulting in the formation of the stack device 206, the second stack side 274, and the stack-through-vias 270.

The removal process can include a planarization process such as polish, grind, sand, saw, cut, or etch, providing a substantially flat surface having characteristics of the planarization process applied. The characteristics of the planarization process includes the second stack side 274 or the ends of the stack-through-vias 270 exposed on the second stack side 274 exhibiting detectable indications such as having been grinded, sanded, sawed, cut, etched, polished, or combinations thereof. As a result of the removal process, the stack-through-vias 270 can be substantially exposed from the stack-organic-material 266 the second stack side 274 and the second stack side 274 of the stack device 206 can be substantially exposed.

Figure 18:
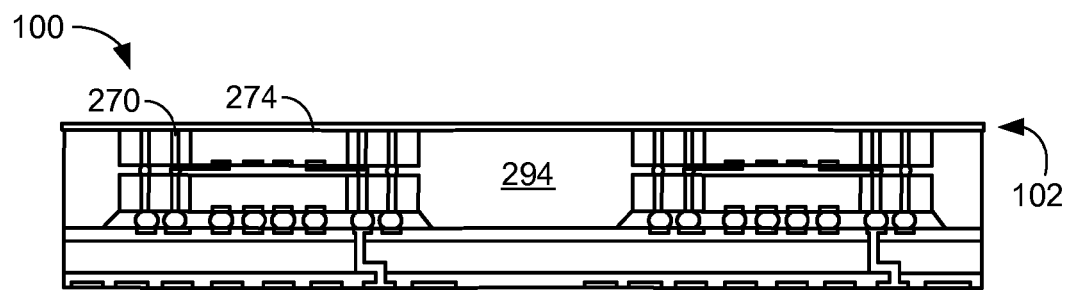
FIG. 18 is the structure of FIG. 17 in a covering phase of the assembly.

Referring now to FIG. 18, therein is shown the structure of FIG. 17 in a covering phase of the assembly. The shield layer 102 can applied over the encapsulant 294 and on to the second stack side 274 using a covering process such as plating, painting, depositing, pasting, or a combination thereof. The shield layer 102 can have electrical connectivity with the ends of the stack-through-vias 270 exposed on the second stack side 274.

Figure 19:
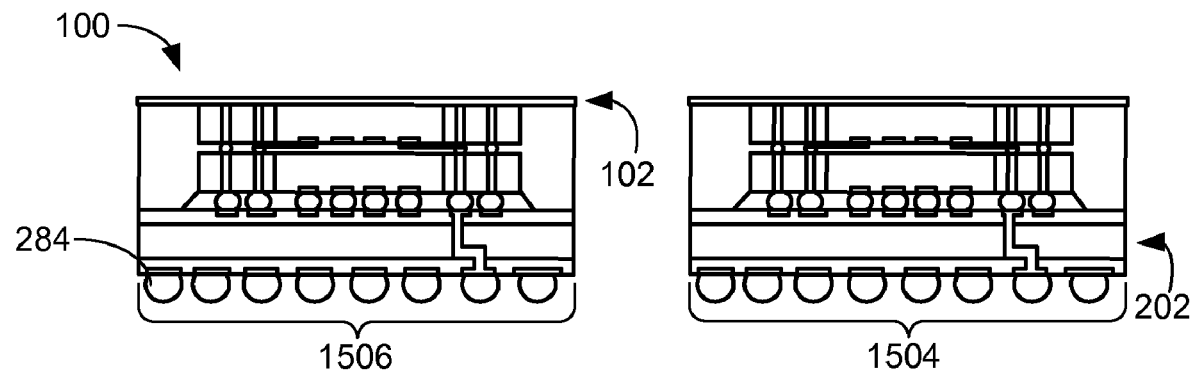
FIG. 19 is the structure of FIG. 18 in a forming phase of the integrated circuit packaging system of FIG. 2.

Referring now to FIG. 19, therein is shown the structure of FIG. 18 in a forming phase of the integrated circuit packaging system of FIG. 2. The first build site 1504 and the second build site 1506 can be separated along a vertical plane perpendicular to the encapsulant 294 of FIG. 18 using a singulation process such as a cutting, a sawing, or a slicing process. The system connectors 284 can be attached to the substrate assembly 202 using the connecting process resulting in the formation of the integrated circuit packaging system 100 of FIG. 2.

Figure 20:
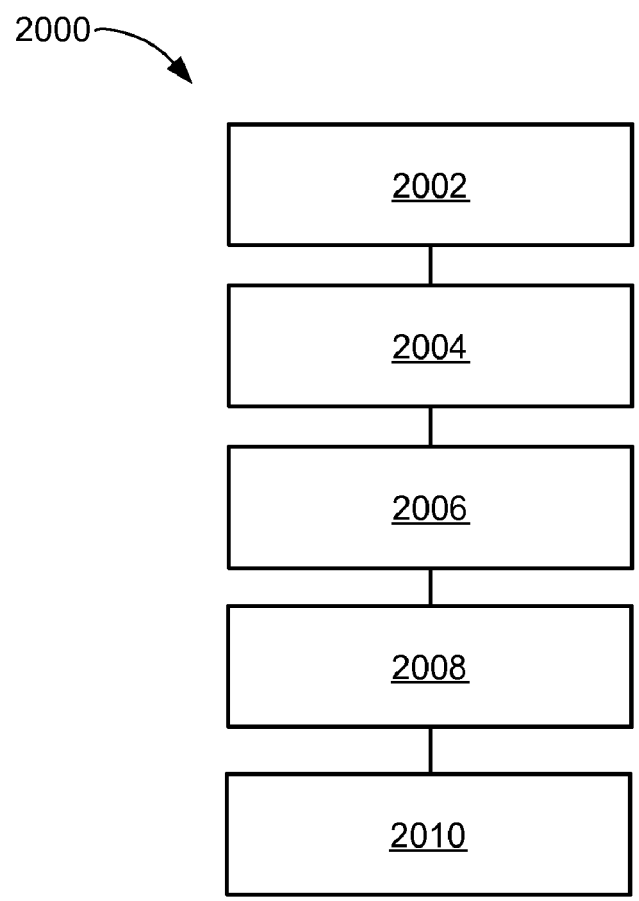
FIG. 20 is a flow chart of a method of manufacture of an integrated circuit packaging system in an embodiment of the present invention.

Referring now to FIG. 20 therein is shown a flow chart of a method 2000 of manufacture of an integrated circuit packaging system in an embodiment of the present invention. The method 2000 includes providing a substrate assembly having a connection path in a block 2002; mounting a base device over the substrate assembly with a mount layer in a block 2004; mounting a stack device over the base device and having a stack die and a stack-organic-material in a block 2006; forming a stack-through-via in the stack-organic-material of the stack device and connected to the stack die and the substrate assembly in a block 2008; and applying a shield layer directly on a planarized surface of the stack-through-via partially exposed from the stack-organic-material in a block 2010.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a substrate assembly having a connection path;
    mounting a base device over the substrate assembly with a mount layer;
    mounting a stack device over the base device and having a stack die and a stack-organic-material;
    forming a stack-through-via in the stack-organic-material of the stack device and connected to the stack die and the substrate assembly; and
    applying a shield layer directly on a planarized surface of the stack-through-via partially exposed from the stack-organic-material.

2. The method as claimed in claim 1 wherein forming the stack-through-via includes forming the stack-through-via partially exposed from the stack-organic-material.

3. The method as claimed in claim 1 further comprising applying a horizontal barrier around the base device.

4. The method as claimed in claim 1 further comprising attaching a conductive bump on the stack-through-via.

5. The method as claimed in claim 1 wherein mounting the base device includes forming a base-through-via in the base device.

6. A method of manufacture of an integrated circuit packaging system comprising:
    providing a substrate assembly having a connection path;
    mounting a base device over the substrate assembly with a mount layer;
    mounting a stack device over the base device and having a stack die and a stack-organic-material;
    forming a stack-through-via in a the stack-organic-material of the stack device and connected to the stack die and the substrate assembly;
    applying an encapsulant over the base device and the stack device; and
    applying a shield layer directly on a planarized surface of the stack-through-via partially exposed from the stack-organic-material.

7. The method as claimed in claim 6 wherein forming the stack-through-via includes forming the stack-through-via partially exposed from the stack-organic-material and sides of the stack device.

8. The method as claimed in claim 6 further comprising applying a horizontal barrier around the stack die.

9. The method as claimed in claim 6 further comprising attaching a conductive bump on the stack-through-via and substantially exposed from the encapsulant.

10. The method as claimed in claim 6 wherein mounting the base device includes forming a base-through-via in a base-organic-material of the base device.

11. An integrated circuit packaging system comprising:
    a substrate assembly having a connection path;
    a base device over the substrate assembly with a mount layer;
    a stack device over the base device and having a stack die and a stack-organic-material;
    a stack-through-via formed in the stack-organic-material of the stack device and connected to the stack die and the substrate assembly; and;
    a shield layer directly on the stack-through-via having a substantially flat surface characteristic of a planarization process and partially exposed from the stack-organic-material.

12. The system as claimed in claim 11 wherein the stack-through-via is formed partially exposed from the stack-organic-material.

13. The system as claimed in claim 11 further comprising a horizontal barrier around the base device.

14. The system as claimed in claim 11 further comprising a conductive bump on the stack-through-via.

15. The system as claimed in claim 11 wherein the base device includes a base-through-via.

16. The system as claimed in claim 11 further comprising an encapsulant applied over the base device and the stack device.

17. The system as claimed in claim 16 wherein the stack-through-via is partially exposed from the stack-organic-material and sides of the stack device.

18. The system as claimed in claim 16 further comprising a horizontal barrier around the base device or the stack die.

19. The system as claimed in claim 16 further comprising a conductive bump on the stack-through-via and substantially exposed from the encapsulant.

20. The system as claimed in claim 16 wherein the base device includes a base-through-via in a base-organic-material of the base device.

* * * * *